United States Patent
Okada et al.

(10) Patent No.: US 8,208,590 B2
(45) Date of Patent: Jun. 26, 2012

(54) FILTER CIRCUIT, AND RECEIVER AND ELECTRONIC DEVICE USING THE SAME FILTER CIRCUIT

(75) Inventors: Eiji Okada, Osaka (JP); Takeshi Fujii, Osaka (JP); Hiroaki Ozeki, Osaka (JP)

(73) Assignee: Panasonic Corporation, Osaka (JP)

( * ) Notice: Subject to any disclaimer, the term of this patent is extended or adjusted under 35 U.S.C. 154(b) by 1027 days.

(21) Appl. No.: 12/159,491

(22) PCT Filed: Nov. 8, 2007

(86) PCT No.: PCT/JP2007/071682
§ 371 (c)(1),
(2), (4) Date: Jun. 27, 2008

(87) PCT Pub. No.: WO2008/059744
PCT Pub. Date: May 22, 2008

(65) Prior Publication Data
US 2010/0260295 A1 Oct. 14, 2010

(30) Foreign Application Priority Data

Nov. 13, 2006 (JP) .................................. 2006-306336

(51) Int. Cl.
*H04B 1/10* (2006.01)
(52) U.S. Cl. ........ 375/350; 375/136; 375/316; 375/322; 375/328; 375/343; 327/531; 327/532
(58) Field of Classification Search .................. 375/135, 375/145, 147, 150, 229, 230, 232, 316, 328, 375/322, 343–345, 346, 350
See application file for complete search history.

(56) References Cited

U.S. PATENT DOCUMENTS

| | | | |
|---|---|---|---|
| 5,852,772 A | 12/1998 | Lampe et al. | |
| 6,466,067 B2 * | 10/2002 | Matsui | 327/156 |
| 7,081,788 B2 | 7/2006 | Hagari | |
| 7,437,133 B2 | 10/2008 | Mudd et al. | |
| 7,684,780 B2 | 3/2010 | Minobe et al. | |
| 7,813,710 B2 | 10/2010 | Katsube et al. | |
| 7,944,273 B1 * | 5/2011 | Vinciarelli et al. | 327/531 |
| 8,054,913 B2 * | 11/2011 | Terada | 375/316 |
| 2003/0078018 A1 | 4/2003 | Mudd et al. | |
| 2004/0097212 A1 * | 5/2004 | Matsumoto et al. | 455/296 |
| 2005/0253647 A1 | 11/2005 | Hagari | |
| 2006/0044057 A1 * | 3/2006 | Hezar et al. | 330/10 |
| 2006/0146579 A1 * | 7/2006 | Lu | 363/16 |
| 2006/0183456 A1 | 8/2006 | Minobe et al. | |
| 2007/0229152 A1 * | 10/2007 | Kosai | 330/100 |
| 2008/0096514 A1 * | 4/2008 | Rahman et al. | 455/307 |
| 2009/0023411 A1 * | 1/2009 | Katsube et al. | 455/307 |

(Continued)

FOREIGN PATENT DOCUMENTS

JP 63-015512 1/1988

(Continued)

*Primary Examiner* — Hirdepal Singh
(74) *Attorney, Agent, or Firm* — Pearne & Gordon LLP (57) ABSTRACT

Filter circuit includes Nth-order active filters switching circuit which switches shorting or non-shorting of active filter, and power-supply control circuit which controls such that a power supply of active filter is turned off when switching circuit shorts active filter. A receiver employing filter circuit turns off the power supply of active filter not needed when no interference wave exists within a given range from a desired frequency band. The foregoing structure allows lowering the power consumption of filter circuit.

14 Claims, 7 Drawing Sheets

U.S. PATENT DOCUMENTS

2010/0311381 A1    12/2010   Katsube et al.

FOREIGN PATENT DOCUMENTS

| | | |
|---|---|---|
| JP | 01-216623 | 8/1989 |
| JP | 05-304485 A | 11/1993 |
| JP | 06-334463 | 12/1994 |
| JP | 09-083296 A | 3/1997 |
| JP | 2001-016121 A | 1/2001 |
| JP | 2001-513275 A | 8/2001 |
| JP | 2003-142967 A | 5/2003 |
| JP | 2003-209479 A | 7/2003 |
| JP | 2005-192018 A | 7/2005 |
| JP | 2005-328260 A | 11/2005 |
| JP | 2006-090436 | 8/2006 |
| WO | 2005-046054 A1 | 5/2005 |
| WO | 2006-090436 A1 | 8/2006 |

* cited by examiner

PRIOR ART

_US 8,208,590 B2_

FILTER CIRCUIT, AND RECEIVER AND ELECTRONIC DEVICE USING THE SAME FILTER CIRCUIT

This application is a U.S. national phase application of PCT International Application Pct/JP2007/071682.

TECHNICAL FIELD

The present invention relates to a filter circuit having active filters, and it also relates to a receiver and an electronic device using the same filter circuit.

BACKGROUND ART

Figure 9:
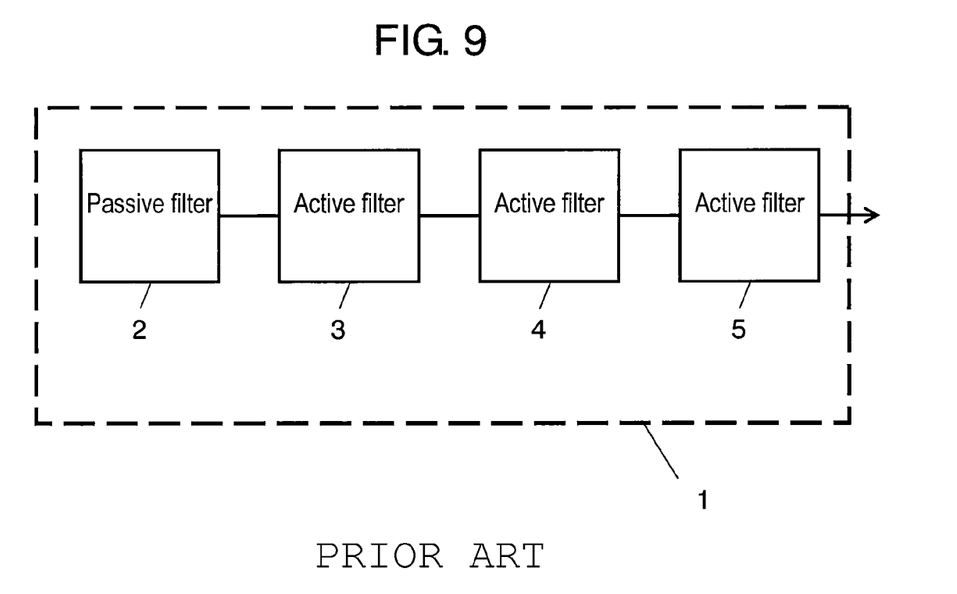
FIG. 9 shows a block diagram of a conventional filter circuit.

FIG. 9 shows a block diagram illustrating a conventional filter circuit. In FIG. 9, conventional filter circuit 1 includes, e.g. first-order passive filter 2, second-order active filter 3, second-order active filter 4, and second-order active filter 5. These filters are sequentially connected in series in this order.

A conventional receiver (not shown) employing a foregoing steep seventh-order filter circuit allows obtaining quality reception even when an interference wave exists in a frequency band adjacent to a desired frequency band. Non-patented document 1 is known as related art to the present invention.

However, the receiver employing the conventional filter circuit discussed above consumes a large amount of power when no interference wave exits in the adjacent frequency band because active filters 3, 4, 5 are kept turning on.

Non-patented document 1: "Primer of CMOS Analog Circuit" (p 225-p 258) published on Jan. 1, 2005 by CQ publishing Co. Ltd, and written by Mr. Kenji Taniguchi

DISCLOSURE OF THE INVENTION

A filter circuit of the present invention allows lowering power consumption, and comprises the following elements:
an Nth-order active filter;
a switching circuit for switching shorting or non-shorting at least a part of the Nth-order active filter; and
a power supply control circuit for controlling at least a part of the Nth-order active filter to turn off when the switch circuit shorts at least a part of the Nth-order active filter.

The foregoing structure allows a receiver employing the filter of the present invention to turn off at least a part of the Nth-order active filter which is not needed when no interference wave exists in a frequency band within a given range from a desired frequency band. As a result, the filter circuit can consume less power.

DESCRIPTION OF REFERENCE MARKS

| | |
|---|---|
| 6 | filter circuit |
| 7 | passive filter |
| 8, 9, 10, 37 | active filter |
| 11, 12, 13 | switch |
| 14 | switching circuit |
| 15 | power supply control circuit |
| 16 | passive element control circuit |
| 17, 18, 19, 20, 21, 25 | passive element switching circuit |

DESCRIPTION OF PREFERRED EMBODIMENTS

Embodiment 1

Figure 1:
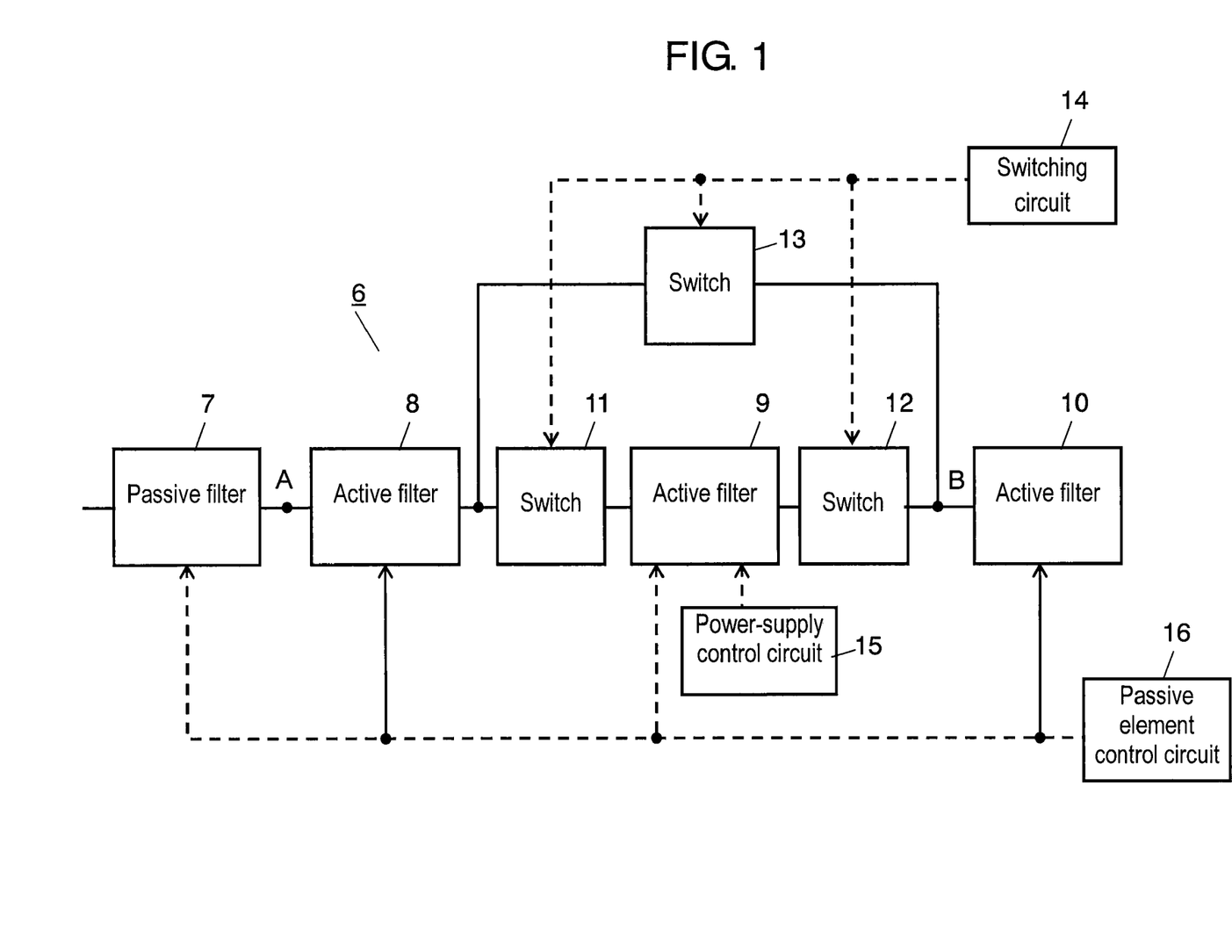
FIG. 1 shows a block diagram of a filter circuit in accordance with a first embodiment of the present invention.

FIG. 1 shows a block diagram of a filter circuit in accordance with the first embodiment of the present invention. In FIG. 1, filter circuit 6 includes, e.g. first-order passive filter 7, second-order active filter 8, second-order active filter 9, and second-order active filter 10. The foregoing filters are connected in series in this order.

Filter circuit 6 also includes switch 11 connected between active filters 8 and 9, switch 12 connected between active filters 9 and 10, switch 13 connected in parallel with switch 11, active filter 9 and switch 12, and it further includes switching circuit 14 that switches active filter 9 to short or not to short through controlling over the foregoing switches. In other words, switching circuit 14 can switch filter circuit 6 to work as a 5th-order filter circuit or to work as a 7th-order filter circuit.

Filter circuit 6 further includes power supply control circuit 15, which is connected to active filter 9 and controls on/off of the power supply of active filter 9. Control circuit 15 controls the power supply of active filter 9 to turn off when switching circuit 14 shorts active filter 9, and controls the power supply of active filter 9 to turn on when switching circuit 14 connects active filter 9 to another circuit.

The foregoing structure allows a receiver (not shown) having filter circuit 6 to turn off the power supply of active filter 9 not needed when no interference wave exists in a frequency band adjacent to a desired frequency band. As a result, filter circuit 6 can consume less power.

Filter circuit 6 further includes a passive element control circuit 16 for controlling a constant of the passive elements formed of resistors and capacitors existing in passive filter 7, active filters 8, 9, and 10. This structure allows optimizing a constant value of the passive elements in passive filter 7, active filters 8, 9 and 10 in response to the cases where active filter 9 is shorted and not shorted.

Active filter 9, which is shorted by switching circuit 14 and is turned off its power supply by power supply control circuit 15, can take any number of orders. Switch 11 or switch 12 is not always needed; however, they are preferably available, because they can reduce adversary effect caused by connecting the passive and active elements of active filter 9 as a load to active filter 8 when active filter 9 is shorted.

Figure 2:
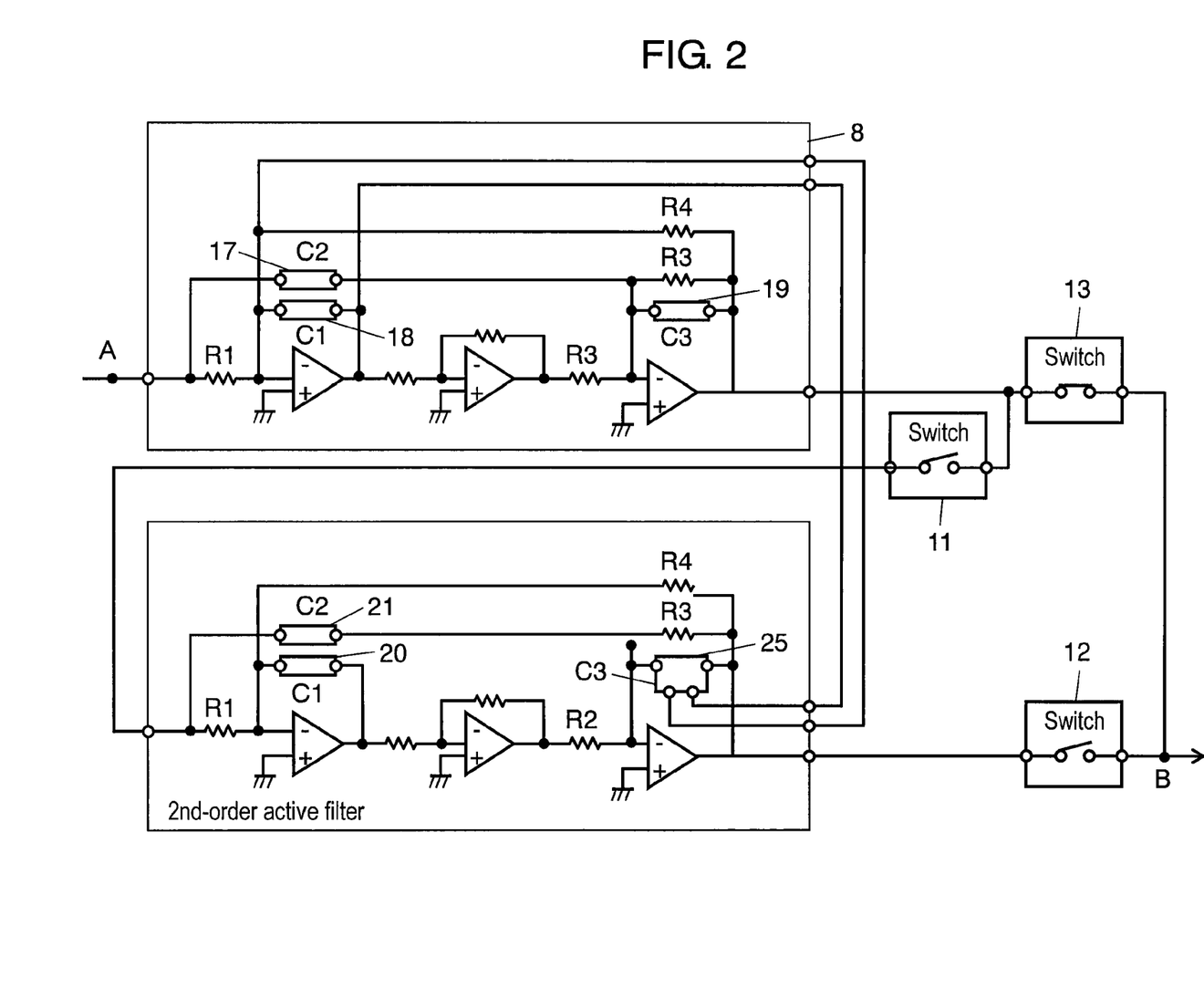
FIG. 2 shows a circuit diagram seated between points A and B in the filter circuit in accordance with the first embodiment of the present invention.
Figure 3:
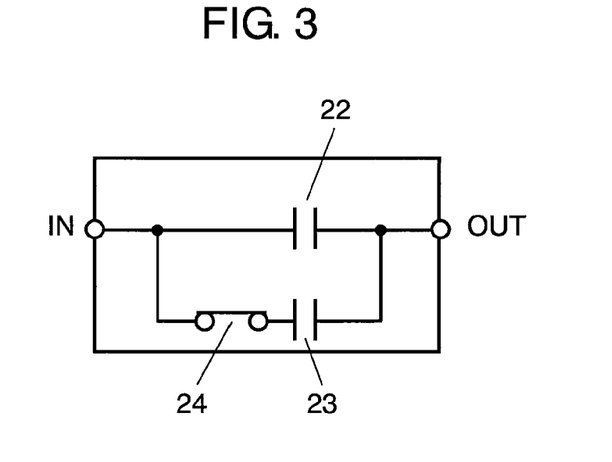
FIG. 3 shows a circuit diagram of a passive-element switching circuit in the filter circuit in accordance with the first embodiment of the present invention.

A configuration of filter circuit 6 is detailed hereinafter. FIG. 2 shows a circuit diagram seated between points A and B in the filter circuit in accordance with the first embodiment of the present invention. FIG. 3 shows a circuit diagram of a passive element switching circuit seated in the filter circuit in accordance with the first embodiment of the present invention. In FIG. 2, each one of passive element switching circuits 17, 18, 19, 20, and 21 placed in active filter 8 or 9 includes first passive element 22 formed of a capacitor and second passive element 23 formed of a capacitor as shown in FIG. 3. Second passive element 23 is coupled in parallel with first passive element 22, and is switched by switch 24 from/to "connecting to element 22" to/from "non-connecting to element 22". Passive element control circuit 16 controls such that a constant of the passive elements placed in active filter 8 or 9 can be optimized through connecting or not connecting second passive element 23 to element 22 in response to the cases where filter circuit 6 works as a 5th-order filter or a 7th-order filter.

Employment of the configuration shown in FIG. 3 into passive element switching circuits 17, 18, 19, 20, and 21 allows second passive element 23 to have a capacity of as small as the difference between the optimized constant in the case of 5th-order filter circuit 6 and that of 7th-order filter circuit 6. As a result, active filters 8 and 9 can be downsized, which eventually downsizes filter circuit 6.

First passive element 22 and second passive element 23 can be coupled together in series, and passive element control circuit 16 can control the constant of the passive elements through shorting or not shorting second passive element 23. In this case, first passive element 22 and second passive element 23 are formed of resistors. This configuration also allows second passive element 23 to have a resistance value of as small as the difference between the optimized constant in the case of 5th-order filter circuit 6 and that of 7th-order filter circuit 6. As a result, active filters 8 and 9 can be downsized.

Figure 4:
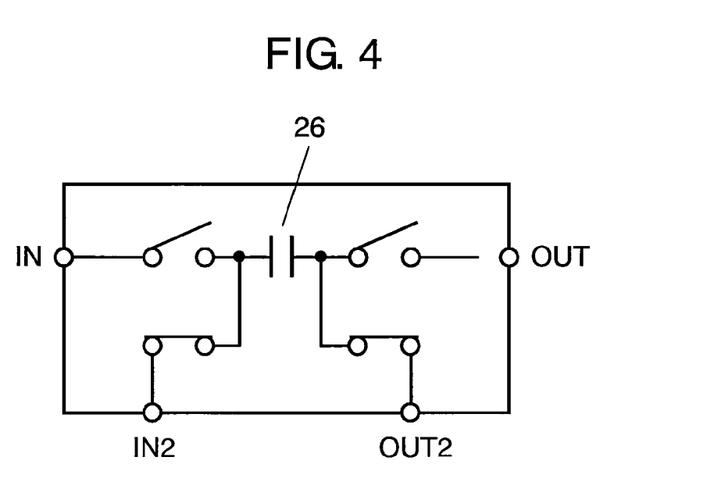
FIG. 4 shows a circuit diagram of a passive-element switching circuit in the filter circuit in accordance with the first embodiment of the present invention.

FIG. 4 shows a circuit diagram of the passive element switching circuit in the filter circuit in accordance with the first embodiment of the present invention. Passive element switching circuit 25 in active filter 9 shown in FIG. 2 is configured such that passive element 26 formed of a capacitor can be switched from/to functioning as a passive element of active filter 8 to/from functioning as a passive element of active filter 9 as shown in FIG. 4. To be more specific, when active filter 9 is turned off, switches 11 and 12 are turned off, and switch 13 is turned on, the switches in passive element switching circuit 25 are controlled such that passive element 26 functions as a passive element of active filter 8. On the other hand, when active filter 9 is turned on, switches 11 and 12 are turned on, and switch 13 is turned off, the switches in passive element switching circuit 25 are controlled such that passive element 26 functions as a passive element of active filter 9. This structure allows lowering a capacity of a passive element of passive element switching circuit 18 in active filter 8.

Passive element switching circuit 18 in active filter 8 is preferably placed adjacently to passive element switching circuit 25 in active filter 9. This structure allows shortening a length of the wire connecting circuit 18 to circuit 25. As a result, parasitic capacitance to the wiring can be reduced, and degradation in the characteristics of filter circuit 6 can be suppressed.

The circuit configurations of active filters 8 and 9 are described hereinbefore, and active filter 10 has a similar configuration to what is described above.

An optimized constant of the passive elements of active filters 8, 9, and 10 is described hereinafter with reference to table 1-table 5.

TABLE 1

|  | R1 | R2 | R3 | R4 | UNIT |
|---|---|---|---|---|---|
| Passive filter 7 | 6 | — | — | — | kΩ |
| Active filter 8 | 6 | 6 | 10 | 6 | kΩ |
| Active filter 9 | 6 | 6 | 10 | 6 | kΩ |
| Active filter 10 | 6 | 6 | 30 | 6 | kΩ |

TABLE 2

|  | C1 | C2 | C3 | UNIT |
|---|---|---|---|---|
| Passive filter 7 | 84.5 | — | — | pF |
| Active filter 8 | 14.8 | 18.3 | 61.5 | pF |
| Active filter 9 | 82.9 | 1.6 | 32.1 | pF |
| Active filter 10 | 9.7 | 38.5 | 71.4 | pF |

TABLE 3

|  | C1 | C2 | C3 | UNIT |
|---|---|---|---|---|
| Passive filter 7 | 68.5 | — | — | pF |
| Active filter 8 | 49.8 | 1.1 | 27.4 | pF |
| Active filter 9 | — | — | — | pF |
| Active filter 10 | 25.3 | 5.4 | 26.9 | pF |

TABLE 4

|  |  | C1 | C2 | C3 | UNIT |
|---|---|---|---|---|---|
| Passive filter 7 | First passive element 22 | 68.5 | — | — | pF |
|  | Second passive element 23 | 16.0 | — | — |  |
| Active filter 8 | First passive element 22 | 14.8 | 1.1 | 27.4 | pF |
|  | Second passive element 23 | 35.0 | 17.2 | 34.1 |  |
| Active filter 9 | First passive element 22 | 62.9 | 1.6 | 32.1 | pF |
|  | Second passive element 23 | — | — | — |  |
| Active filter 10 | First passive element 22 | 9.7 | 5.4 | 26.9 | pF |
|  | Second passive element 23 | 15.6 | 33.1 | 44.5 |  |

TABLE 5

|  |  | C1 | C2 | C3 | UNIT |
|---|---|---|---|---|---|
| Passive filter 7 | First passive element 22 | 68.5 | — | — | pF |
|  | Second passive element 23 | 16.0 | — | — |  |
| Active filter 8 | First passive element 22 | 14.8 | 1.1 | 27.4 | pF |
|  | Second passive element 23 | 2.9 | 17.2 | 34.1 |  |
| Active filter 9 | First passive element 22 | 62.9 | 1.6 | 32.1 | pF |
|  | Second passive element 23 | — | — | — |  |
| Active filter 10 | First passive element 22 | 9.7 | 5.4 | 26.9 | pF |
|  | Second passive element 23 | 15.6 | 33.1 | 44.5 |  |

Table 1 shows respective constants (in kΩs) of resistors R1, R2, R3, and R4 in filters 7, 8, 9, and 10 in response to the case where filter circuit 6 works as the 5th-order filter or the 7th-order filter. Table 2 shows respective constants (in pFs) of capacitors C1, C2, and C3 in filters 7, 8, 9, and 10 in the case where filter circuit 6 works as the 7th-order filter. Table 3 shows respective constants (in pFs) of capacitors C1, C2, and C3 in filters 7, 8, 9, and 10 in the case where filter circuit uses 5th-order filter. These constants shown in table 1-table 3 are only examples, and other constants can be used in order to obtain necessary characteristics.

Figure 5:
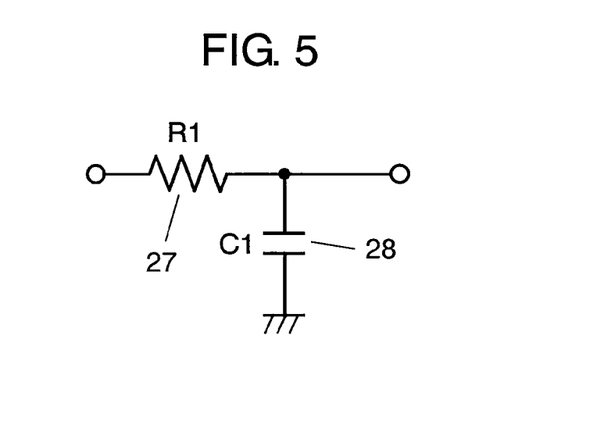
FIG. 5 shows a circuit diagram of a passive filter in the filter circuit in accordance with the first embodiment of the present invention.

Table 4 shows constants (in pFs) of first passive element 22 and second passive element 23 of capacitors C1, C2, and C3 in filters 7, 8, 9, and 10 in the case where passive element 26 in active filter 8 is not used as the passive element of active filter 9. Table 5 shows constants (in pFs) of first passive element 22 and second passive element 23 of capacitors C1, C2, and C3 in filters 7, 8, 9, and 10 in the case where passive element 26 in active filter 8 is used as the passive element of active filter 9. Capacitors C1, C2, C3, and resistors R1, R2, R3, R4 are the passive elements shown in FIG. 2 and FIG. 5. Comparison between table 4 and table 5 proves that second passive element 23 in active filter 8 has a smaller capacity when passive element 26 in active filter 8 functions as the passive element of active filter 9 in filter circuit 6.

Figure 6:
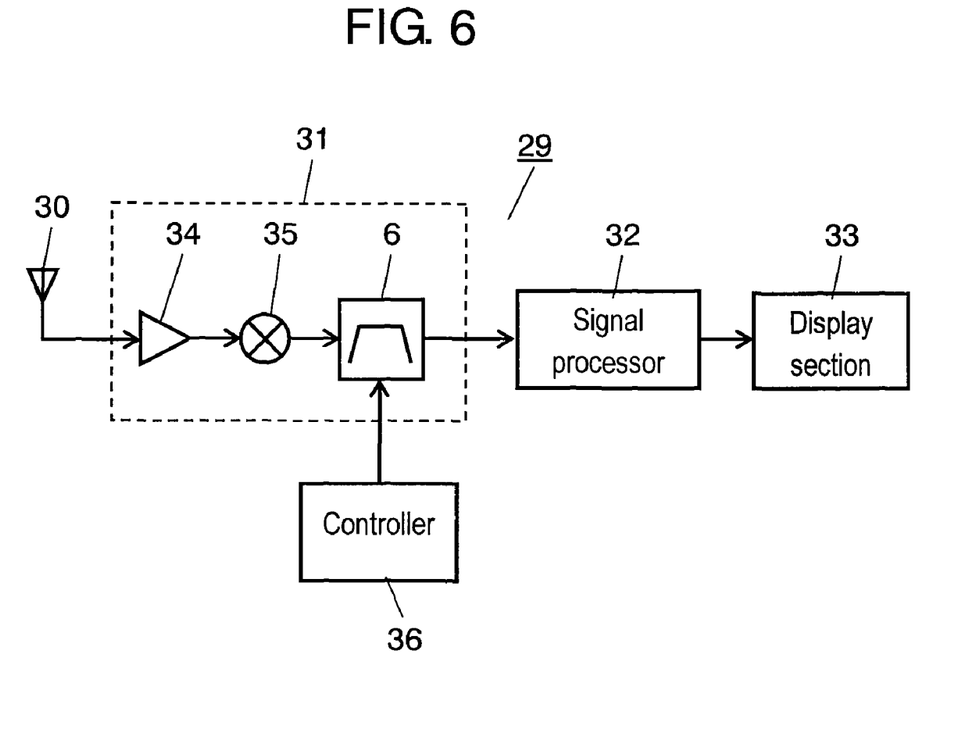
FIG. 6 shows a block diagram of an electric device which employs the filter circuit in accordance with the first embodiment of the present invention.

An electronic device employing filter circuit 6 in accordance with this first embodiment is demonstrated hereinafter. FIG. 6 shows a block diagram of the electronic device employing the filter circuit in accordance with the first embodiment of the present invention. In FIG. 6, electronic device 29 employing filter circuit 6 includes the following elements:
  antenna 30;
  receiver 31 for tuning to the signal supplied from antenna 30;
  signal processor 32 for demodulating the signal supplied from receiver 31; and
  display section 33 for displaying the signal supplied from signal processor 32.

Receiver 31 includes amplifier 34 for amplifying the signal supplied from antenna 30, and mixer 35 for converting the signal supplied from amplifier 34 into an intermediate frequency. Filter circuit 6 in accordance with the first embodiment is connected to an output terminal of mixer 35. Filter circuit 6 is connected to controller 36 at its another input terminal. Controller 36 controls over switching circuit 14, power-supply control circuit 15, and passive element control circuit 16.

Figure 7A:
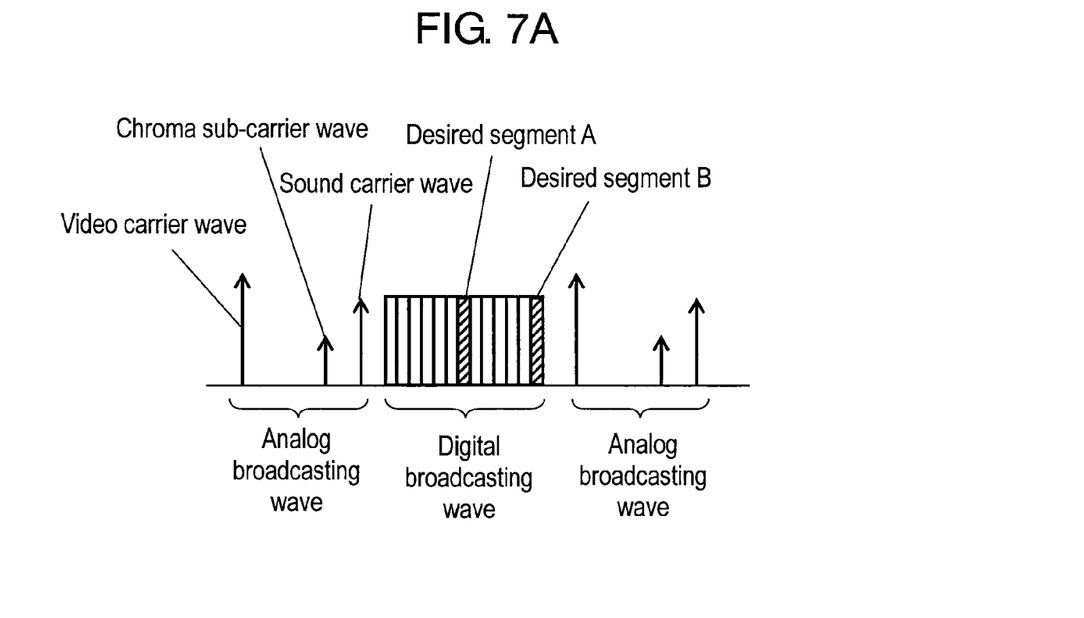
FIG. 7A schematically shows a relation between a desired frequency band and an interference frequency in the filter circuit in accordance with the first embodiment of the present invention.
Figure 7B:
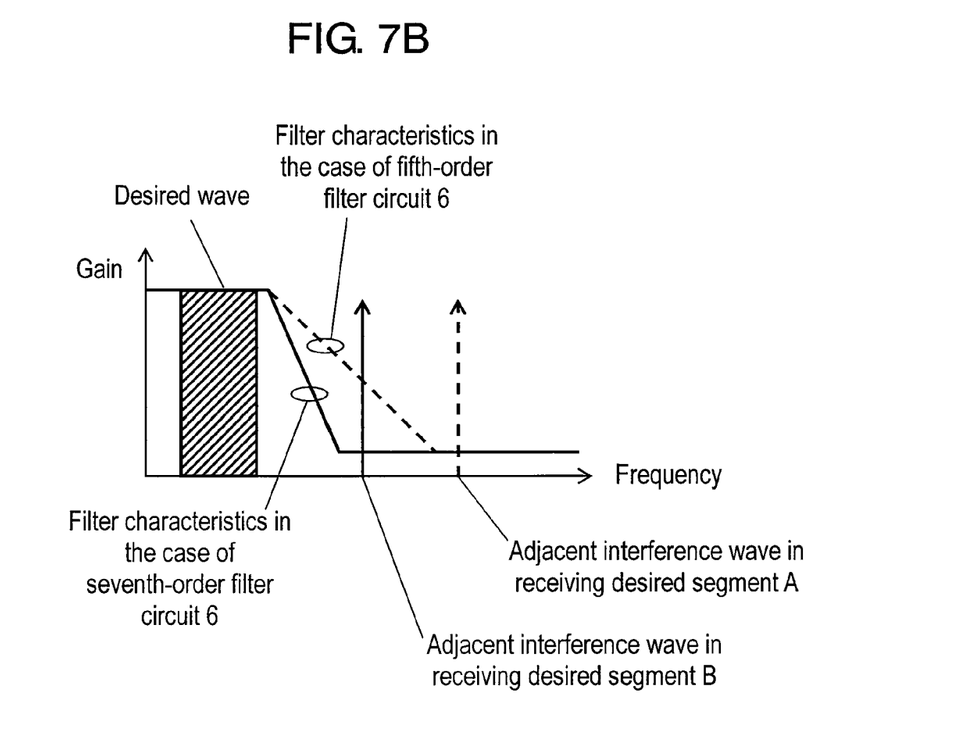
FIG. 7B schematically shows a relation between a desired frequency band and an interference frequency in the filter circuit in accordance with the first embodiment of the present invention.

An operation of electronic device 29 employing filter circuit 6 is demonstrated hereinafter. FIGS. 7A and 7B show relations between a desired frequency band and an interference frequency band in the filter circuit in accordance with the first embodiment. To be more specific, FIG. 7A shows a spectrum in the case where a channel of digital broadcasting is adjacent to a channel of analog broadcasting. FIG. 7B shows a relation between the desired frequency band and the interference frequency band supplied from mixer 35 in the case of receiving desired segment A and desired segment B as shown in FIG. 7A. In FIG. 7A, the digital broadcasting wave is split into segments, and electronic device 29 needs to receive at least one segment in order to obtain information. Electronic device 29 receives the digital broadcasting wave and an analog broadcasting wave mixed together. The signals received by device 29 is converted into the intermediate frequency by mixer 35, and signals other than desired segments are suppressed by filter circuit 6. In FIG. 7B, when desired segment B is received, an interference wave frequency exists within a given range from the desired frequency band, and when desired segment A is received, no interference frequency wave exists within the given range. Controller 36 thus sets filter circuit 6 to works as the 7th-order filter in receiving desired segment B, and sets filter circuit 6 to work as the 5th-order filter in receiving desired segment A. A method of setting a number of orders of filter circuit 6 is as discussed above, namely, controller 36 controls switching circuit 14, power-supply control circuit 15, and passive element control circuit 16 in response to a desired frequency band. This control allows turning off the power supply of active filter 9, which is not needed in such a case as no interference wave exists within a given range from the desired frequency band because filter 9, so that filter circuit 6 consumes less power. As a result, the power consumption of electronic device 29 can be lowered.

Controller 36 includes a memory device (not shown) for storing, e.g. channel information, so that controller 36 can determine whether or not an interference wave exists within a given range from a desired frequency band based on the channel information stored in this memory device in response to channels and segments to be tuned to, thereby controlling switching circuit 14, power-supply control circuit 15, and passive element control circuit 16. The channel information stored in the memory device can be rewritten by using a communication function or a removable medium, so that the information can be always updated. A broadcasting station and a channel placement change depending on a receiving location, so that electronic device 29 is preferably equipped with a positional information acquiring device (not shown) such as GPS for automatically setting a region. In this case, controller 36 can control switching circuit 14, power-supply control circuit 15, and passive element control circuit 16 with ease even when controller 36 moves.

Transmission power of a digital broadcasting is boosted step by step in order to alleviate adverse effect to the analog broadcasting, so that a difference in the transmission power between broadcasting stations becomes greater. This preparation causes the D/U (desire/undesired) ratio to be greater; however, after the analog broadcasting is stopped, the difference in the transmission power between the broadcasting stations becomes small, and the D/U ration also becomes smaller. Controller 36 thus controls switching circuit 14, power-supply control circuit 15, and passive element control circuit 16 such that the power supply of active filter 9, which is not needed, is turned off after the analogue broadcasting stops. This method allows lowering the power consumption of filter circuit 6, and eventually lowers the power consumption of electronic device 29.

Receiver 31 can be equipped with a detector (not shown) connected to an output terminal of filter circuit 6 for detecting an interference wave level so that controller 36 can control switching circuit 14, power-supply control circuit 15, and passive element control circuit 16 in response to the interference wave level detected by this detector. To be more specific, controller 36 makes active filter 9 function when the interference wave level exceeds a given level, and shorts active filter 9, which is not needed in such a case as the level is lower than the given level. This structure allows lowering the power consumption of filter circuit 6, and eventually lowering the power consumption of electronic device 29.

In the foregoing descriptions, filter circuit 6 is formed by combining a passive filter and active filters; however, it can be formed of active filters only.

Embodiment 2

Figure 8:
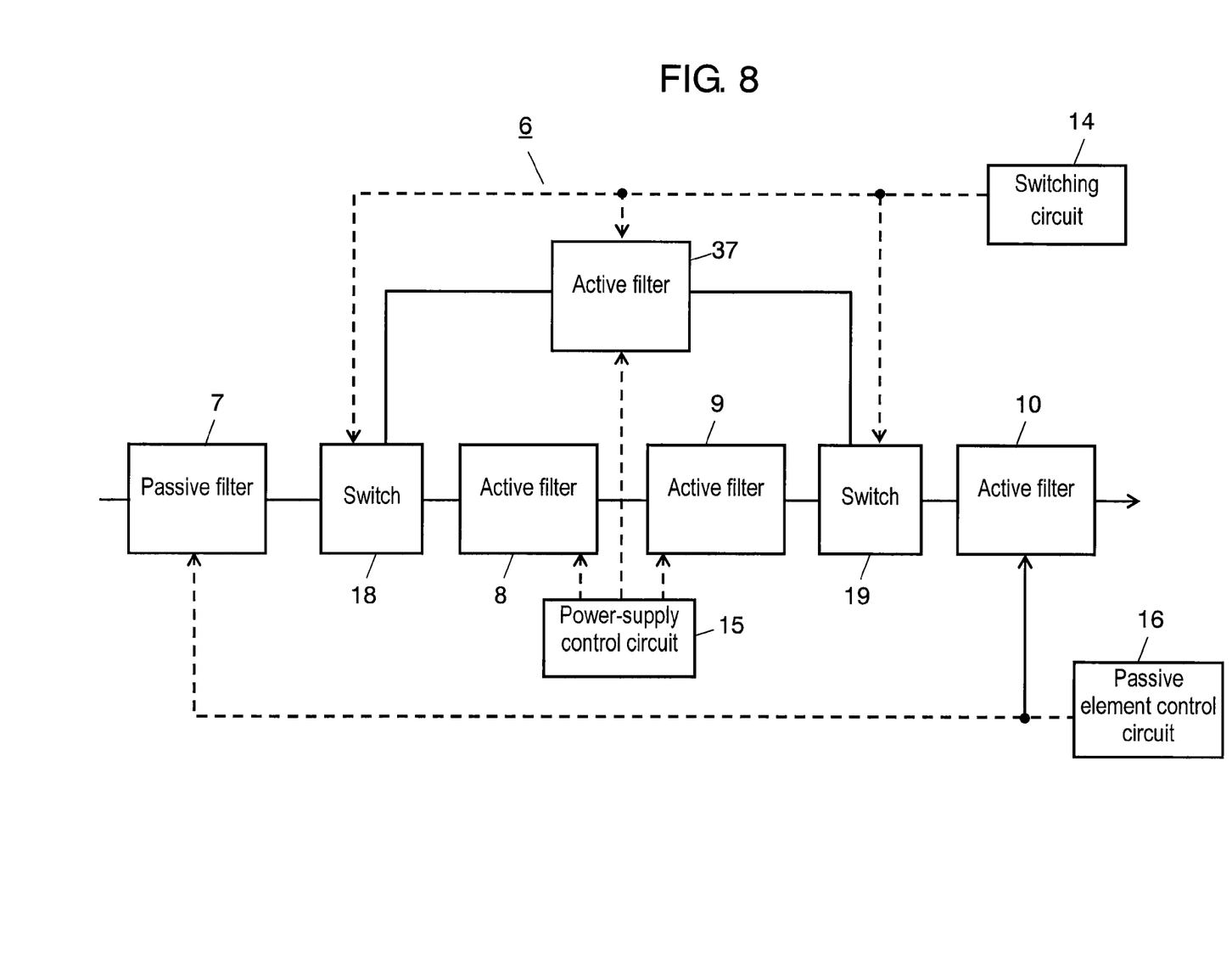
FIG. 8 shows a block diagram of a filter circuit in accordance with a second embodiment of the present invention.

FIG. 8 shows a block diagram of filter circuit 6 in accordance with the second embodiment. In FIG. 8, filter circuit 6 differs from that used in the first embodiment in having Mth-order active filter 37 coupled in parallel with Nth-order active filters 8 and 9. Assume that N>M, switching circuit 14 switches the connection between Nth-order active filter 8, 9 and Mth-order active filter 37, and power-supply control circuit 15 controls such that one of active filters 8, 9 and 10 is turned off its power supply, where this one is opened by switching circuit 14. Passive element control circuit 16 switches the constant of the passive elements of passive filter 7 and active filter 10 based on a number of orders of filter circuit 6. This structure allows using active filter 37 having a fewer number of orders, and turning off the power supplies of active filters 8 and 9 having a greater number of orders. As a result, the power consumption of filter circuit 6 can be lowered.

INDUSTRIAL APPLICABILITY

A filter circuit of the present invention allows lowering its power consumption, so that it can be used in electronic devices such as a tuner and, a portable terminal.

The invention claimed is:

1. A filter circuit comprising:
an Nth-order active filter;
a switching circuit for switching at least a part of the Nth-order active filter to be shorted or not to be shorted;
a power-supply control circuit for turning off a power supply of at least the part of the Nth-order active filter when the switching circuit shorts at least the part of the Nth-order active filter; and
a passive element control circuit for controlling a constant of a passive element of the Nth-order active filter,
wherein the passive element control circuit switches the passive element of the Nth-order active filter, of which power supply is turned off by the power-supply control circuit, to function as a passive element of the Nth-order active filter of which power supply is turned on.

2. The filter circuit of claim 1 further comprising:
a switch disposed respectively before and after at least a part of the Nth-order active filter; and
a switch coupled in parallel with the switches and at least a part of the Nth-order active filter.

3. The filter circuit of claim 1, wherein the Nth-order active filter includes a first passive element and a second passive element coupled in parallel with the first passive element,
wherein the passive element control circuit controls a constant of the passive elements depending on an open or a not-open of the second passive element.

4. The filter circuit of claim 1, wherein the Nth-order active filter includes a first passive element and a second passive element coupled in series to the first passive element,
wherein the passive element control circuit controls a constant of the passive elements depending on a short or a not-short of the second passive element.

5. The filter circuit of claim 1, wherein the passive element of the Nth-order active filter of which power supply is turned off is disposed adjacently to the passive element of the Nth-order active filter of which power supply is turned on.

6. A filter circuit comprising: an Nth-order active filter;
an Mth-order active filter coupled in parallel with the Nth-order active filter;
a switching circuit for switching a connection between the Nth-order active filter and the Mth-order active filter;
a power-supply control circuit for turning off a power-supply of one of the Nth-order active filter and the Mth-order active filter, where the power supply is turned off for that active filter which one is opened by the switching circuit; and
a passive element control circuit for controlling a constant of a passive element of one of the Nth-order active element and the Mth-order active element,
wherein the passive element control circuit switches a passive element of a first active filter, of which power supply is turned off by the power supply control circuit, to function as a passive element of a second active filter, of which power supply is turned on.

7. A receiver comprising:
a mixer; and
a filter circuit coupled to an output side of the mixer;
wherein the filter circuit includes:
an Nth-order active filter;
a switching circuit for switching at least a part of the Nth-order active filter to be shorted or not to be shorted;
a power-supply control circuit for turning off a power supply of at least the part of the Nth-order active filter when the switching circuit shorts at least the part of the Nth-order active filter; and
a passive element control circuit for controlling a constant of a passive element of the Nth-order active filter,
wherein the passive element control circuit switches the passive element of the Nth-order active filter, of which power supply is turned off by the power-supply control circuit, to function as a passive element of the Nth-order active filter of which power supply is turned on.

8. The receiver of claim 7 further comprising a detector coupled to an output side of the filter circuit for detecting an interference wave level,
wherein the receiver controls the switching circuit and the power-supply control circuit in response to the interference wave level detected by the detector.

9. The receiver as defined in claim 7, wherein the receiver controls the power supply of the Nth-order active filter, which is opened by the switching circuit, to be turned off in response to a stop of analog broadcasting.

10. An electronic device employing the receiver as defined in claim 7.

11. A receiver comprising:
a mixer; and
a filter circuit coupled to an output side of the mixer;
wherein the filter circuit includes:
an Nth-order active filter;
an Mth-order active filter coupled in parallel with the Nth-order active filter;
a switching circuit for switching a connection between the Nth-order active filter and the Mth-order active filter;
a power-supply control circuit for turning off a power-supply of one of the Nth-order active filter and the Mth-order active filter, where the power supply is turned off for that active filter which one is opened by the switching circuit; and
a passive element control circuit for controlling a constant of a passive element of one of the Nth-order active element and the Mth-order active element,
wherein the passive element control circuit switches a passive element of a first active filter, of which power supply is turned off by the power supply control circuit, to function as a passive element of a second active filter, of which power supply is turned on.

12. The receiver of claim 11 further comprising a detector coupled to an output side of the filter circuit for detecting an interference wave level,
wherein the receiver controls the switching circuit and the power-supply control circuit in response to the interference wave level detected by the detector.

13. The receiver as defined in claim 11,
wherein the receiver controls the power supply of the Nth-order active filter, which is opened by the switching circuit, to be turned off in response to a stop of analog broadcasting.

14. An electronic device employing the receiver as defined in claim 11.

* * * * *